(12) United States Patent
Chen et al.

(10) Patent No.: US 10,079,067 B1
(45) Date of Patent: Sep. 18, 2018

(54) DATA READ METHOD AND A NON-VOLATILE MEMORY APPARATUS USING THE SAME

(71) Applicant: Winbond Electronics Corp., Taichung (TW)

(72) Inventors: Frederick Chen, San Jose, CA (US); Shao-Ching Liao, Taichung (TW); Ping-Kun Wang, Taichung (TW); Chia-Hua Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/697,469

(22) Filed: Sep. 7, 2017

(51) Int. Cl.
| | | |
|---|---|---|
| *G11C 11/00* | (2006.01) | |
| *G11C 16/34* | (2006.01) | |
| *G11C 16/04* | (2006.01) | |
| *G11C 16/24* | (2006.01) | |
| *G11C 11/56* | (2006.01) | |
| *G11C 13/00* | (2006.01) | |
| *G11C 11/16* | (2006.01) | |

(52) U.S. Cl.
CPC ...... *G11C 16/3422* (2013.01); *G11C 11/1673* (2013.01); *G11C 11/5628* (2013.01); *G11C 11/5642* (2013.01); *G11C 13/003* (2013.01); *G11C 13/0026* (2013.01); *G11C 16/0483* (2013.01); *G11C 16/24* (2013.01)

(58) Field of Classification Search
CPC .......................... G11C 16/3422; G11C 11/1672
USPC .......................................... 365/148, 157, 163
See application file for complete search history.

(56) References Cited

U.S. PATENT DOCUMENTS

| | | | | |
|---|---|---|---|---|
| 9,472,265 | B2 | 10/2016 | Manning | |
| 2009/0219756 | A1* | 9/2009 | Schroegmeier | G11C 11/5614 365/163 |
| 2013/0279237 | A1* | 10/2013 | Huang | G11C 13/004 365/148 |
| 2016/0380030 | A1* | 12/2016 | Boivin | H01L 27/2436 257/5 |

FOREIGN PATENT DOCUMENTS

WO     2016064416     4/2016

OTHER PUBLICATIONS

Cosmin Radu Pupa, "Voltage and Current Multiplier Circuits," Synthesis of Computational Structures for Analog Signal Processing, Aug. 31, 2011, pp. 89-184.
Madrenas et al., "Self-controlled 4-transistor low-power min-max current selector," International Journal of Electronics and Communications, Jul. 5, 2009, pp. 871-876.

* cited by examiner

*Primary Examiner* — Vu Le
(74) *Attorney, Agent, or Firm* — JCIPRNET

(57) ABSTRACT

A data read method and a non-volatile memory apparatus using the same are provided. The data read method includes: obtaining a first read current and a second read current from a memory cell pair of the non-volatile memory; performing a calculation operation according to the first read current and the second read current to obtain a calculation result; and determining a logical state of the memory cell pair according to the calculation result. The calculation operation includes at least a signal addition operation and a signal multiplying operation.

20 Claims, 5 Drawing Sheets

DATA READ METHOD AND A NON-VOLATILE MEMORY APPARATUS USING THE SAME

BACKGROUND

Field of the Invention

The invention relates to a memory apparatus, and more particularly, to a data read method and a non-volatile memory apparatus using the data read method.

Description of Related Art

A nonvolatile memory is capable of saving stored data after the power is turned off and is thus an indispensable memory device for many electronic products to function properly. Currently, a resistive random access memory (RRAM) is a type of nonvolatile memory that is being actively developed in the industry, which has advantages of having a low voltage for write operation, spending a short time for writing and erasing, having a long memorizing time, perfuming non-destructive read operation, being capable of multi-state memory, having a simple structure and small required area. Consequently, RRAM has great potential in the applications in personal computers and electronic apparatuses in the future.

Generally, a resistive memory cell is used as one bit of the RRAM and may be set to a low-resistive state (LRS) or a high-resistive state (HRS) in a reversible and non-volatile manner, so as to represent storage data with the different states. For instance, a RESET pulse may be applied to form the high-resistive state for writing data of logic 1. A SET pulse with an opposite polarity may be applied to form the low-resistive state for writing data of logic 0. Thereby, during data reading, the data of logic 1 or of logic 0 may be read according to read currents generated in different resistive states.

However, the resistance of the low-resistive state usually tends toward being increased at a high temperature, while the resistance of the high-resistive state usually tends toward being reduced at the high temperature. Such situation that the resistances vary with the temperatures usually leads to difficulty in differentiating the low-resistive state from the high-resistive state. Accordingly, it is helpful to provide a data read method for improving the high temperature data retention (HTDR).

SUMMARY

The invention provides a data read method and a non-volatile memory apparatus using the data read method, by which the high temperature data retention (HTDR) may be improved and the bit error rate may be reduced.

The invention provides a data read method for a non-volatile memory. The data read method includes obtaining a first read current and a second read current from a memory cell pair of the non-volatile memory; performing a calculation operation according to the first read current and the second read current to obtain a calculation result; and determining a logical state of the memory cell pair according to the calculation result. The calculation operation includes at least a signal addition operation and a signal multiplying operation.

The invention also provides a non-volatile memory apparatus including a memory, a signal processing circuit, and a state determination circuit. The memory array includes multiple memory cell pairs. The signal processing circuit is coupled to the memory array, and includes at least a signal addition circuit and a signal multiplication circuit. The state determination circuit is coupled to the signal processing circuit and configured to determine a logical state. The signal processing circuit receives a first read current and a second read current from one of the plurality of memory cell pairs, and performs a calculation operation by the signal addition circuit and the signal multiplication circuit according to the first read current and the second read current to obtain a calculation result. The state determination circuit receives the calculation result and determines the logical state of the corresponding memory cell pair according to the calculation result.

To sum up, in the data read method and the non-volatile memory apparatus using the same provided in the exemplary embodiments of the invention, the two read current from two memory cells of a memory cell pair are processed through at least one addition calculation and at least one multiplication calculation, and the processed result is used for determining a logical state of the memory cell pair. As a result, the data storage of the non-volatile memory apparatus becomes robust under a high temperature stress, thus the bit error rate may be reduced.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
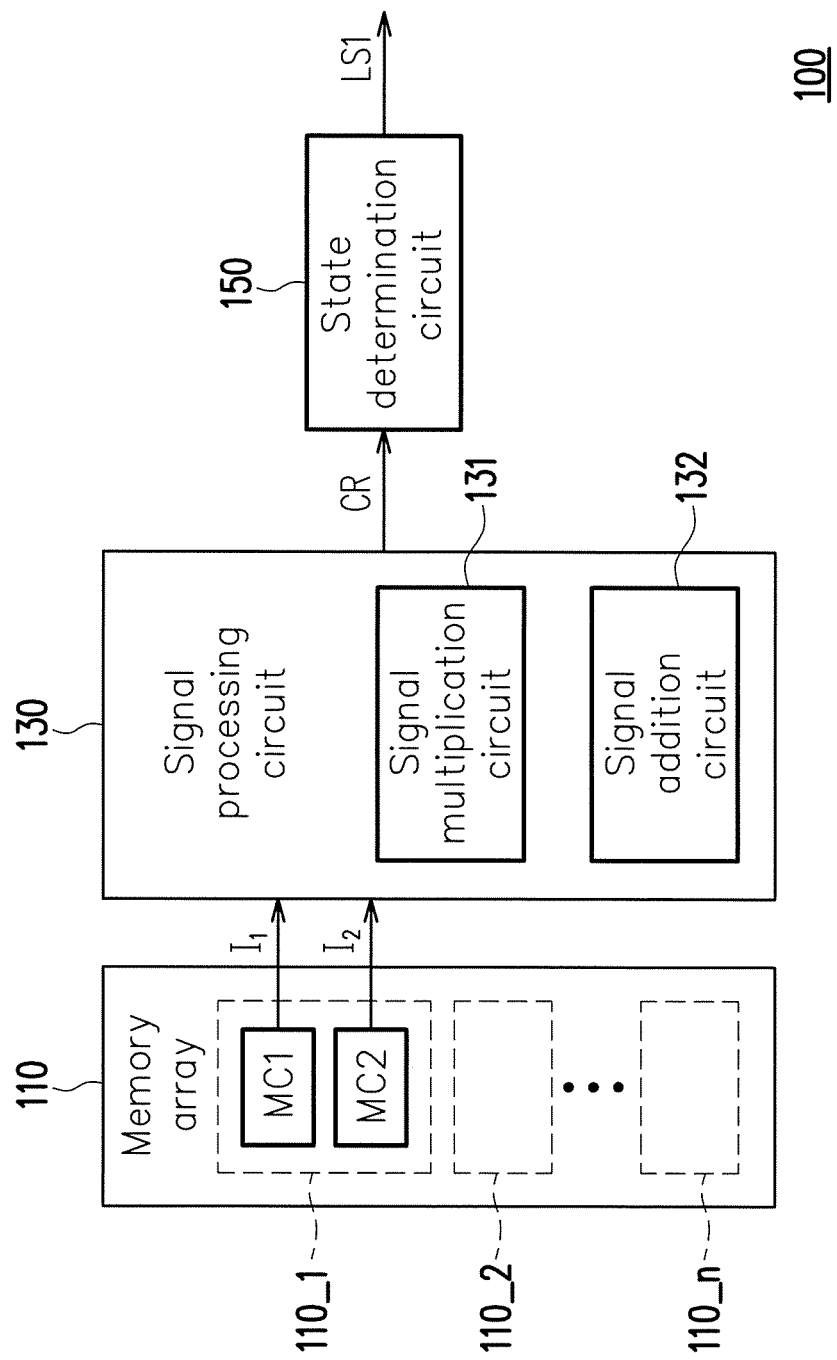
FIG. 1 illustrates a schematic block diagram of a non-volatile memory apparatus according to an embodiment of the invention.

FIG. 1 illustrates a schematic block diagram of a non-volatile memory apparatus according to an embodiment of the invention. Referring to FIG. 1, the non-volatile memory (NVM) 100 includes a memory array 110, a signal processing circuit 130, and a state determination circuit 150. The signal processing circuit 130 is coupled to the memory array 110, and the state determination circuit 150 is coupled to the signal processing circuit 130. The memory array 110 includes a plurality of memory cells and each two memory cells form a memory cell pair. As shown in FIG. 1, the memory array 110 includes a plurality of memory cell pairs 110_1 to **110_*n*, and each memory cell pair includes two memory cells. Taking the memory cell pair 110_1 as an example, the memory cell pair 110_1** includes a first memory cell MC1 and a second memory cell MC2.

In one embodiment, the NVM 100 is a resistive random access memory (RRAM) employing a two-transistor-two-resistor (2T2R) structure. In which, each memory cell pair is used for representing one-bit data of the NVM 100. To be specific, for an RRAM employing one-transistor-one-resistor (1T1R) structure, each memory cell including one transistor and one resistor is used for representing one-bit data, and the read current of each memory cell is sensed for determining the logical state (i.e., LRS or HRS) of the data stored in the corresponding memory cell. For the RRAM 100 employing the 2T2R structure in this embodiment, each memory cell pair including two memory cells is used for representing one-bit data of the RRAM, and two respective read currents of the two memory cells thereof may be used for determining the logical state of the data stored in the corresponding memory cell pair. In other embodiments, the NVM 100 may be a magnetoresistive random access memory (MRAM) or other similar memory apparatuses, which is not limited herein.

According to the embodiments of the invention, two read currents may be processed by the signal processing circuit 130 before determining a logical state, in order to improve the HTDR and/or the cycling sensitivity.

Figure 2:
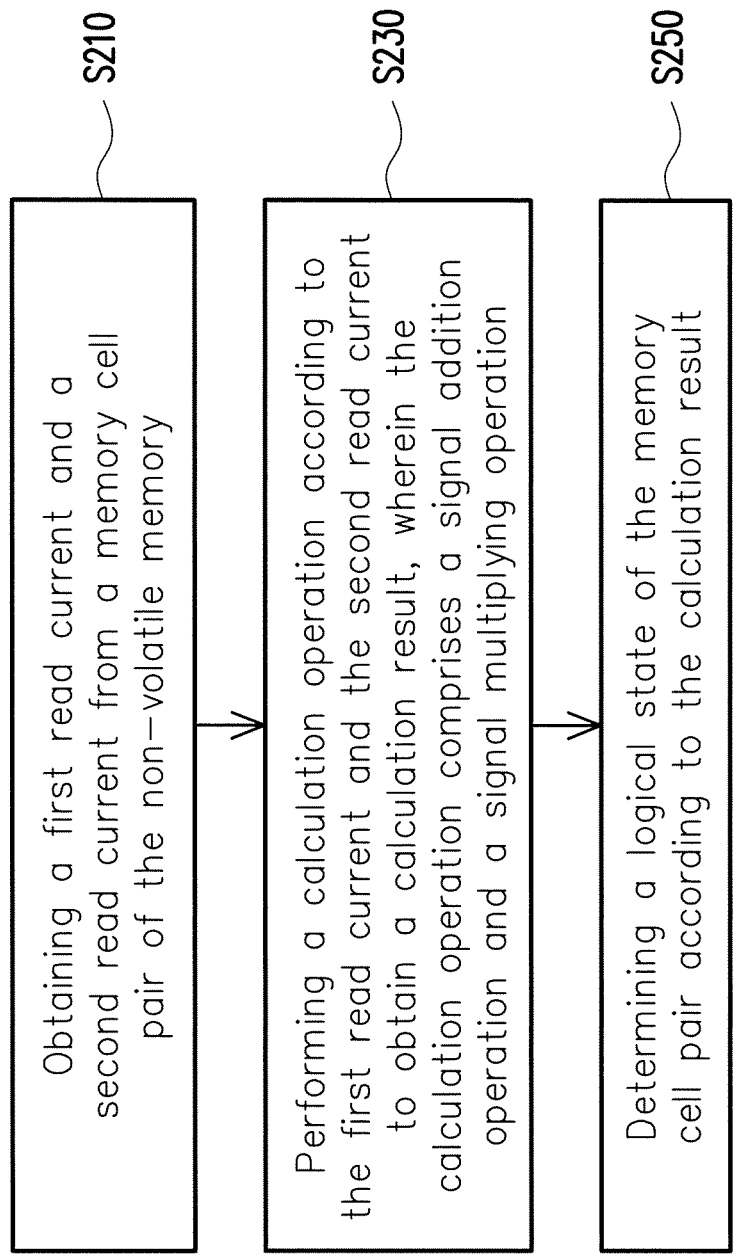
FIG. 2 is a flowchart illustrating a reading method of the resistive memory apparatus according to an embodiment of the invention.

FIG. 2 illustrates a flowchart of a data read method according to an embodiment of the invention. Referring to both FIG. 1 and FIG. 2, the data read method of the embodiment is at least adapted for, for example, the NVM 100 depicted in FIG. 1. Each step of the data read method of the embodiment of the invention will be described with reference to each element in the NVM 100 below.

Noted that the memory cell pair 110_1 is taken as an example for describing each step of the data read method for convenience of description. However, data of the other memory cell pairs (e.g., 110_2 to 110_$n$) of the NVM 100 can also be read by the similar way.

In step S210, the signal processing circuit 130 obtains a first read current I1 and a second read current I2 from a memory cell pair of the NVM 100. In one embodiment, the NVM 100 is an RRAM employing the 2T2R structure. A fixed voltage (e.g., 0.2V) is applied on the first memory cell MC1 and the second memory cell MC2, and the first read current I1 and the second read current I2 are thus generated, in response to the respective resistances of the first memory cell MC1 and the second memory cell MC2. The first read current I1 and the second read current I2, for example, flow into two input terminals of the signal processing circuit 130.

In step S230, the signal processing circuit 130 performs a calculation operation according to the first read current I1 and the second read current I2 to obtain a calculation result CR. Advantageously, the signal processing circuit 130 includes a signal multiplication circuit 131 and a signal addition circuit 132.

The signal multiplication circuit 131 includes at least one multiplier, each multiplier is configured to carry out a multiplication calculation, and can be implemented in either analog or digital. For example, the multiplier has two input terminals for receiving two signals, and multiplies these two received signals together to generate a product result. For another example, the multiplier has only one input terminal for receiving one signal, and calculates $n^{th}$ power (e.g., square or cube, etc.) of the received signal to generate a product result. By adopting the multiplication calculation, the logical state LS1 of HRS can be recognized correctly. That is, noise while recognizing the logical state LS1 of HRS can be reduced. People having skill in the art may implement the signal multiplication circuit 131 based on the contemporary technologies, which is not limited herein.

The signal addition circuit 132 includes at least one adder, each adder is configured to carry out an addition calculation. For example, the adder has at least two input terminals each for receiving one signal, and the adder adds all the received signals together to generate a summation result. Similarly, people having skill in the art may implement the signal addition circuit 132 based on the contemporary technologies, which is not limited herein.

In one embodiment of the invention, the signal multiplication circuit 131 is configured as a previous stage to the signal addition circuit 132. That is, at least one output terminal of the signal multiplication circuit 131 is connected to at least one input terminal of the signal addition circuit 132 in the signal processing circuit 130, and the output terminal of the signal addition circuit 132 is coupled to the state determination circuit 150.

In another embodiment of the invention, the signal addition circuit 132 is configured as a previous stage to the signal multiplication circuit 131. That is, at least one output terminal of the signal addition circuit 132 is connected to at least one input terminal of the signal multiplication circuit 131 in the signal processing circuit 130, and the at least one output terminal of the signal multiplication circuit 131 is coupled to the state determination circuit 150.

According to the first read current I1 and the second read current I2, at least one multiplication calculation and at least one addition calculation are carried out by the signal processing circuit 130 before determination of the logical state LS1 of the memory cell pair 110_1. The calculation result CR generated by the signal processing circuit 130, for example, is then transmitted to the state determination circuit 150.

In step S250, the state determination circuit 150 determines a logical state LS1 of the memory cell pair 110_1 according to the calculation result CR. To be specific, the state determination circuit 150 may determine the logical state LS1 of the memory cell pair 110_1 according to the magnitude of the signal output from the signal processing circuit 130. It is noted that the number of the logical state LS1 of the memory cell pair 110_1 is not limited in the invention.

A preset threshold may be set in the state determination circuit 150, the logical state LS1 of the memory cell pair may be determined as a first state (e.g., 0) if the calculation result CR is greater than the preset threshold, and be determined as a second state (e.g., 1) if the calculation result CR is less than or equal to the preset threshold. In other embodiments, more thresholds may be set for distinguishing more states of the logical state LS1 of the memory cell pair 110_1.

In one embodiment, the state determination circuit 150 may be part of a memory control circuit of the NVM 100, which is in charge of the overall operations of the NVM 100. In another embodiment, the state determination circuit 150 may be implemented as a central processing unit (CPU), a microprocessor, a digital signal processor (DSP), a programmable controller, a programmable logic device (PLD) or any other similar device or a combination of the devices, which is not limited herein.

Several exemplary embodiments are described below for introducing various implementations of the NVM 100 using the data read method provided in the invention. It is noted that the invention should not be limited by those embodiments, modifications to the described embodiments may be made without departing from the spirit of the invention.

Figure 3:
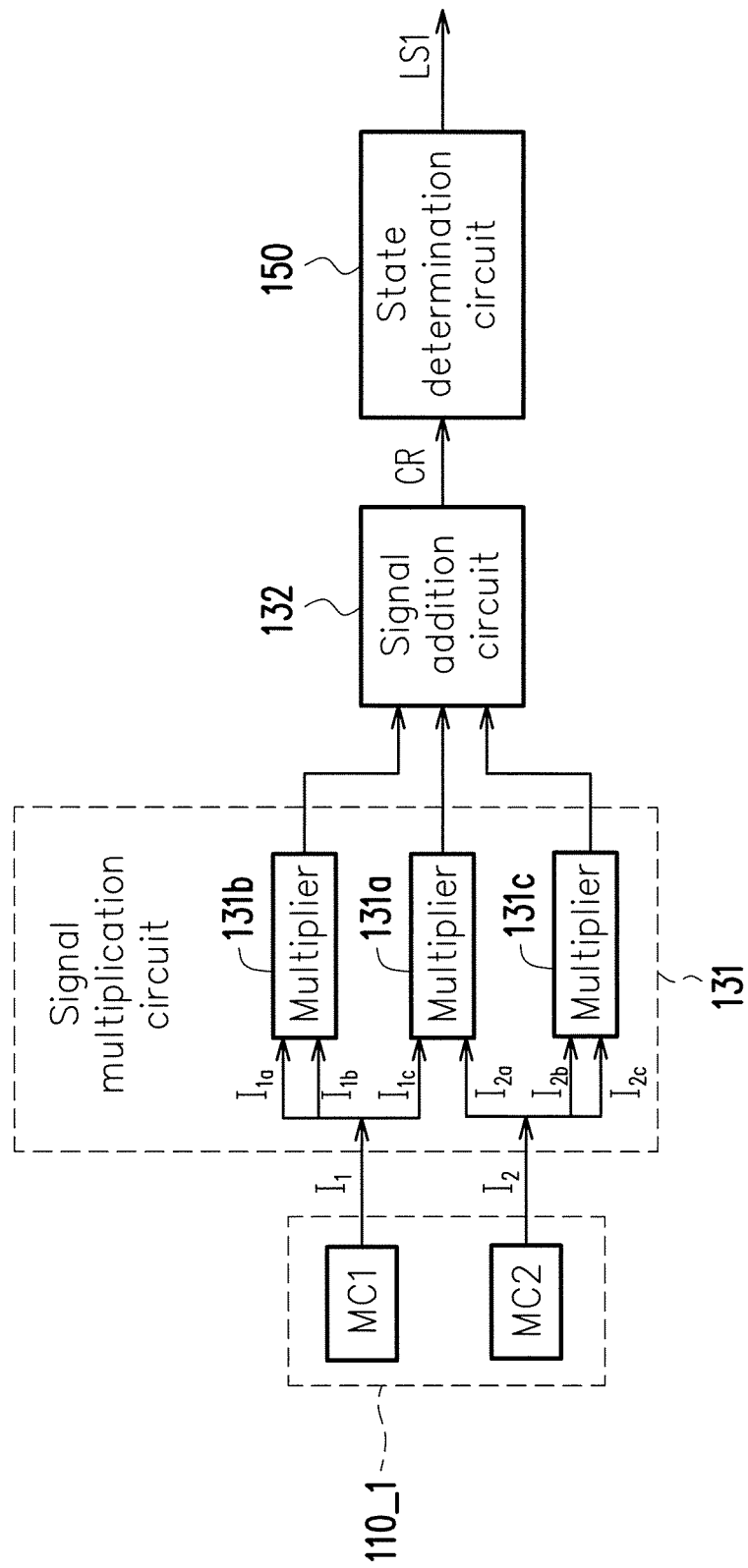
FIG. 3 is a flowchart illustrating a schematic block diagram of a non-volatile memory apparatus according to an embodiment of the invention.

FIG. 3 illustrates a schematic block diagram of a non-volatile memory apparatus according to an embodiment of the invention. Referring to FIG. 3, the signal multiplication circuit 131 is configured as a previous stage to the signal addition circuit 132, and the signal multiplication circuit 131 includes three multipliers 131a, 131b, and 131c.

In the present embodiment, the first read current I1 is divided into the first read current I1a, the first read current I1b and the first read current I1c. The first read current I1a and the first read current I1b flow into an input terminal of the multiplier 131b, and the first read current I1c flows into an input terminal of the multiplier 131a. On the other hand, the second read current I2 is divided into the second read current I2a, the second read current I2b, and the second read current I2c. The second read current I2a flows into another input terminal of the multiplier 131a, and the second read current I2b and the second read current I2c flow into an input terminal of the multiplier 131c.

It should be noted that the exact current value of each division of the currents I1a, I1b, I1c, I2a, I2b, and I2c is inherited from the impedances of at least the three multipliers 131a, 131b, and 131c.

The multiplier 131a has an output terminal coupled to the signal addition circuit 132. In the embodiment, the multiplier 131a multiplies the received first read current I1c by the received second read current I2a to generate a first product, and outputs the first product to the signal addition circuit 132.

The multiplier 131b has an output terminal coupled to the signal addition circuit 132. In the embodiment, the multiplier 131b multiplies the received first read current I1a by the received first read current I1b to generate a second product, and outputs the second product to the signal addition circuit 132. Specifically, the multiplier 131b may square the received first read current I1a to generate the second product when the received first read current I1a has a same current value as the received first read current I1b, and then outputs the second product to the signal addition circuit 132.

The multiplier 131c has an output terminal coupled to the signal addition circuit 132. In the embodiment, the multiplier 131c multiplies the received second read current I2b by the received second read current I2c to generate a third product, and outputs the third product to the signal addition circuit 132. Specifically, the multiplier 131c may square the received second read current I2b to generate the third product when the received second read current I2b has a same current value as the received second read current I2c, and then outputs the third product to the signal addition circuit 132.

In the embodiment, the signal addition circuit 132 includes an adder, which adds the three received products (i.e., the first, second, and third product) to generate the calculation result CR. The signal addition circuit 132 may then output the calculation result CR to the state determination circuit 150 for determining the logical state LS1 of the memory cell pair 110_1.

Figure 4:
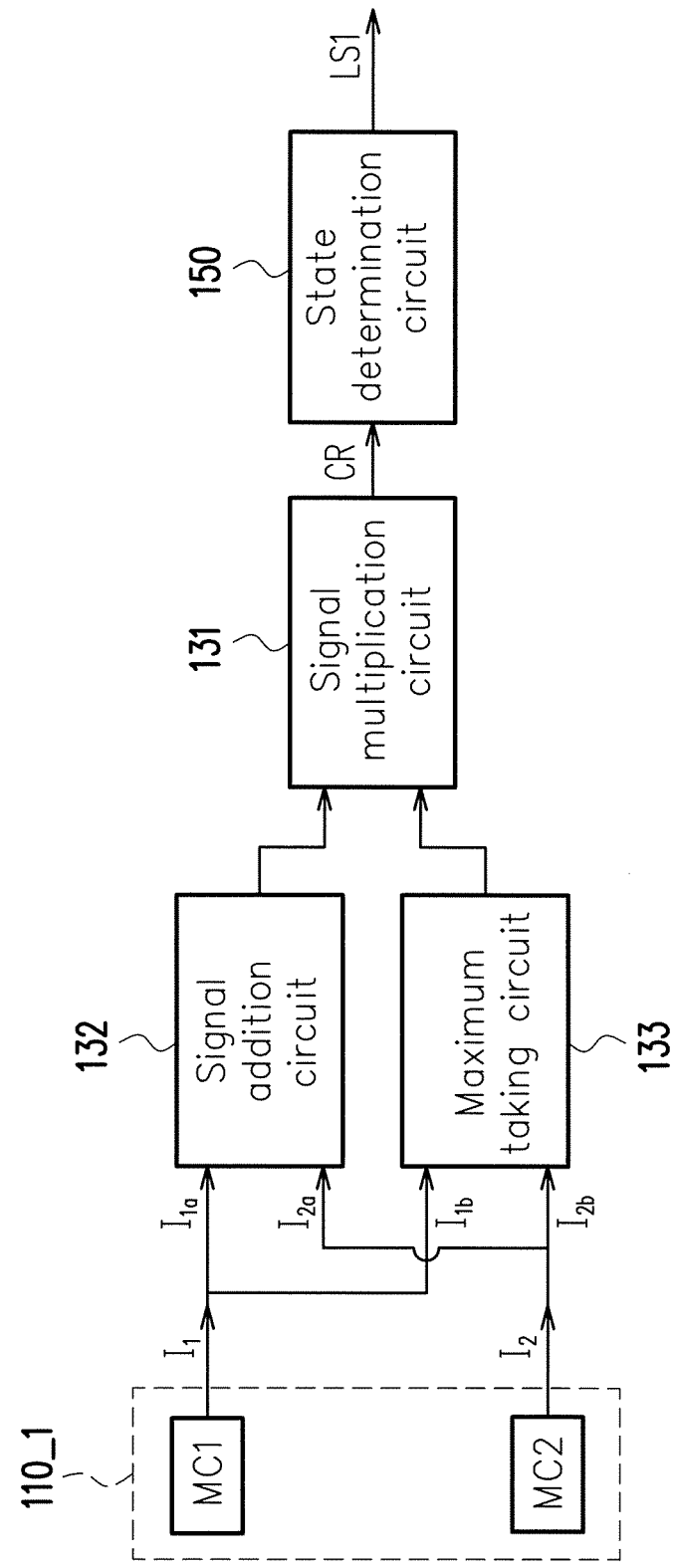
FIG. 4 is a flowchart illustrating a schematic block diagram of a non-volatile memory apparatus according to an embodiment of the invention.

FIG. 4 illustrates a schematic block diagram of a non-volatile memory apparatus according to an embodiment of the invention. Referring to FIG. 4, the signal addition circuit 132 is configured as a previous stage to the signal multiplication circuit 131. Advantageously, in the present embodiment, the signal processing circuit 130 further includes a maximum taking circuit 133 which is also configured as a previous stage to the signal multiplication circuit 131. The maximum taking circuit 133 helps for clearly recognizing the logical state LS1 of the memory cell pair 110_1, and thus lowers the bit error rate. To be specific, the maximum taking circuit 133 helps for clearly recognizing the logical state LS1 of LRS. People having skill in the art may implement the maximum taking circuit 133 for taking a maximum from all input terminals thereof based on the contemporary technologies, which is not limited herein.

In the present embodiment, the first read current I1 is divided into the first read current I1a and the first read current I1b. The first read current I1a flows into an input terminal of the signal addition circuit 132 and the first read current I1b flows into an input terminal of the maximum taking circuit 133. On the other hand, the second read current I2 is divided into the second read current I2a and the second read current I2b. The second read current I2a flows into another input terminal of the signal addition circuit 132 and the second read current I2b flows into another input terminal of the maximum taking circuit 133.

As mentioned before, the exact current value of each division of the currents I1a, I1b, I2a, and I2b is inherited from the impedances of the signal addition circuit 132 and the maximum taking circuit 133.

The signal addition circuit 132 has an output terminal coupled to the signal multiplication circuit 131. In the embodiment, the signal addition circuit 132 (adder) adds the received first read current I1a and the second read current I2a to generate a summation, and outputs the summation to the signal multiplication circuit 131.

The maximum taking circuit 133 has an output coupled to the signal multiplication circuit 131. In the embodiment, the maximum taking circuit 133 takes a maximum of the received first read current I1b and the second read current I2b, and outputs the maximum to the signal multiplication circuit 131.

In the embodiment, the signal multiplication 131 includes one single multiplier, which multiplies the received summation and the received maximum to generate the calculation result CR. The signal multiplication circuit 131 may then output the calculation result CR to the state determination circuit 150 for determining the logical state LS1 of the memory cell pair 110_1.

Figure 5:
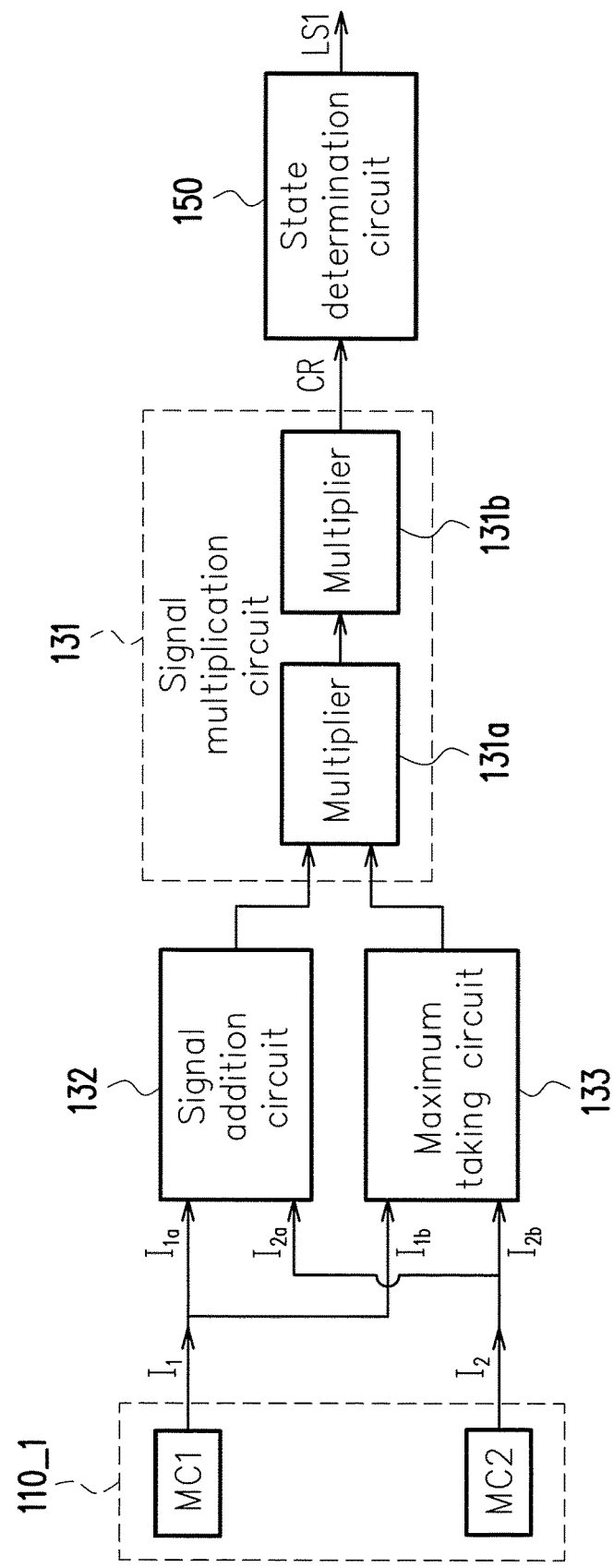
FIG. 5 is a flowchart illustrating a schematic block diagram of a non-volatile memory apparatus according to an embodiment of the invention.

FIG. 5 illustrates a schematic block diagram of a non-volatile memory apparatus according to an embodiment of the invention. Referring to FIG. 5, the structure of the NVM 100 in the present embodiment is similar to that in the embodiment of FIG. 4, where the difference therebetween is that the signal multiplication circuit 131 includes one more multiplier. Advantageously, in the present embodiment, the bit error rate may be further lowered attribute to the additional multiplier. And, the margin between the smallest calculation result for recognizing the logical state LS1 of LRS and the largest calculation result for recognizing the logical state LS1 of HRS can be broader.

In the present embodiment, the signal multiplication circuit 131 includes a first multiplier 131a and a second multiplier 131b, and the two multipliers 131a and 131b are connected to each other in series, as shown in FIG. 5.

The first multiplier 131a receives the summation from the signal addition circuit 132 and receives the maximum from the maximum taking circuit 133. After that, the first multiplier 131a multiplies the received summation and the received maximum to generate a product, then output the product to the second multiplier 131b. The multiplier 131b may multiply the product by the product itself for taking second power of the product as the calculation result CR. Then the multiplier 131b outputs the calculation result CR to the state determination circuit 150 for determining the logical state LS1 of the memory cell pair 110_1.

It is noted that the second multiplier 131b may reduce the bit error rate when reading data stored in the NVM. In another embodiment, the signal multiplication circuit 131 may include more than two multipliers for taking more power of the product generated by the first multiplier 131a. As a result, the bit error rate may be further reduced. In other words, the signal multiplication circuit 131 may include at least one multiplier, so as to take $n^{th}$ power of the product of the summation and the maximum, where n is a natural number depending on the number of the multiplier included in the signal multiplication circuit 131.

To summarize, in the data read method and the non-volatile memory apparatus provided by the embodiments of the invention, after two read currents are sensed from two memory cells of a memory cell pair, at least one signal addition circuit and at least one signal multiplication circuit are configured to process these two read currents for determining the logical state of the memory cell pair, therefore the data storage of the non-volatile memory apparatus becomes robust under a high temperature stress, thus the bit error rate may be reduced. On the other hand, at least one maximum taking circuit is further participating in processing the two read currents. Accordingly, the bit error rate may be further reduced.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data read method for a non-volatile memory, comprising:
    obtaining a first read current and a second read current from a memory cell pair of the non-volatile memory;
    performing a calculation operation according to the first read current and the second read current to obtain a calculation result; and
    determining a logical state of the memory cell pair according to the calculation result, wherein the calculation operation comprises a signal addition operation and a signal multiplying operation.

2. The data read method as claimed in claim 1, wherein the non-volatile memory is a resistive random access memory employing a two-transistor-two-resistor structure, and the memory cell pair represents one-bit data of the resistive random access memory.

3. The data read method as claimed in claim 1, wherein the memory cell pair comprises a first memory cell and a second memory cell, wherein obtaining the first read current and the second read current from the memory cell pair of the non-volatile memory comprises:
    obtaining a first read current from the first memory cell; and
    obtaining a second read current from the second memory cell.

4. The data read method as claimed in claim 1, wherein performing calculation operation according to the first read current and the second read current to obtain the calculation result comprises:
    multiplying the first read current by the second read current to obtain a first product; and
    performing the signal addition operation according to the first product to obtain the calculation result.

5. The data read method as claimed in claim 4, wherein performing calculation operation according to the first read current and the second read current to obtain the calculation result further comprises:
    squaring the first read current to obtain a second product;
    squaring the second read current to obtain a third product; and
    performing the signal addition operation according to the first product, the second product and the third product to obtain the calculation result.

6. The data read method as claimed in claim 5, wherein performing the signal addition operation according to the first product, the second product and the third product to obtain the calculation result further comprises:
    calculating a summation of the first product, the second product and the third product to serve as the calculation result.

7. The data read method as claimed in claim 1, wherein performing calculation operation according to the first read current and the second read current to obtain the calculation result comprises:
    adding the first read current and the second read current to obtain a summation;
    performing the signal multiplying operation according to the summation to obtain the calculation result.

8. The data read method as claimed in claim 7, wherein calculation operation further comprises a maximum taking operation, wherein performing calculation operation according to the first read current and the second read current to obtain the calculation result further comprises:
    taking a maximum of the first read current and the second read current; and
    performing the signal multiplying operation according to the summation and the maximum to obtain the calculation result.

9. The data read method as claimed in claim 8, wherein performing the signal multiplying operation according to the summation and the maximum to obtain the calculation result comprises:
    calculating a product of the summation and the maximum; and
    taking $n^{th}$ power of the product as the calculation result, wherein n is a natural number.

10. The data read method as claimed in claim 1, wherein the non-volatile memory is a magnetoresistive random access memory.

11. A non-volatile memory apparatus, comprising:
    a memory array comprising a plurality of memory cell pairs;
    a signal processing circuit, coupled to the memory array, and comprising a signal addition circuit and a signal multiplication circuit; and
    a state determination circuit, coupled to the signal processing circuit and configured to determine a logical state,
    wherein the signal processing circuit receives a first read current and a second read current from one of the plurality of memory cell pairs, and perform is a calculation operation by the signal addition circuit and the signal multiplication circuit according to the first read current and the second read current to obtain a calculation result,
    wherein the state determination circuit receives the calculation result and determines the logical state of the corresponding memory cell pair according to the calculation result.

12. The non-volatile memory apparatus as claimed in claim 11, wherein the non-volatile memory apparatus is a resistive random access memory employing a two-transistor-two-resistor structure, and each memory cell pair represents one-bit data of the resistive random access memory.

13. The non-volatile memory apparatus as claimed in claim 11, wherein each memory cell pair comprises a first memory cell and a second memory cell, wherein the signal processing circuit receives the first read current and the second read current from the first memory cell and the second memory cell of the corresponding memory cell pair respectively.

14. The non-volatile memory apparatus as claimed in claim 11, wherein the signal multiplication circuit receive the first read current and the second current, multiplies the received first read current by the received second read current to obtain a first product, and outputs the first product to the signal addition circuit.

15. The non-volatile memory apparatus as claimed in claim 14, wherein the signal multiplication circuit squares the received first read current to obtain a second product, squares the received second read current to obtain a third product, and outputs the second product and the third product to the signal addition circuit.

16. The non-volatile memory apparatus as claimed in claim 15, wherein the signal addition circuit adds the first product, the second product and the third product to obtain the calculation result.

17. The non-volatile memory apparatus as claimed in claim 11, wherein the signal addition circuit receives the first read current and the second read current, adds the received first read current and the received second read current to obtain a summation, and output the summation to the signal multiplication circuit.

18. The non-volatile memory apparatus as claimed in claim 17, wherein the signal processing circuit further comprises a maximum taking circuit, wherein the maximum taking circuit receives the first read current and the second read current, takes a maximum of the first read current and the second read current, and output the maximum to the signal multiplication circuit.

19. The non-volatile memory apparatus as claimed in claim 18, wherein the signal multiplication circuit multiplies the summation by the maximum to obtain a product, and takes $n^{th}$ power of the product as the calculation result.

20. The non-volatile memory apparatus as claimed in claim 11, wherein the non-volatile memory is a magnetoresistive random access memory.

\* \* \* \* \*